United States Patent [19]

Buxton

[11] Patent Number: 5,232,143
[45] Date of Patent: Aug. 3, 1993

[54] MULTI-CHIP DIE BONDER

[75] Inventor: Howard D. Buxton, Phoenix, Ariz.

[73] Assignee: Motorola, Inc., Schaumburg, Ill.

[21] Appl. No.: 732,883

[22] Filed: Jul. 19, 1991

[51] Int. Cl.$^5$ ............................................. H01L 21/50
[52] U.S. Cl. .......................................... 228/6.2; 228/9
[58] Field of Search ..................... 228/6.2, 9, 44.7, 47, 228/179, 180.2

[56] References Cited

U.S. PATENT DOCUMENTS 4,881,319 11/1989 Yagi et al. ............................. 228/6.2

FOREIGN PATENT DOCUMENTS 153742 11/1981 Japan ..................................... 228/6.2
63836 4/1982 Japan ..................................... 228/6.2
24635 2/1987 Japan ..................................... 228/6.2

Primary Examiner—Samuel M. Heinrich
Attorney, Agent, or Firm—Joe E. Barbee

[57] ABSTRACT

A multi-chip semiconductor die bonder having a plurality of die handling chucks (23) and associated collets (14) which serve to pick up a plurality of semiconductor die (16) then position and bond each semiconductor die in position on a package (17). A plurality of mechanically controlled slides serve to move and correctly position both the plurality of semiconductor die (16) and the package (17) during the bonding process. The die bonder can bond the plurality of semiconductor die (16) in the package (17) without requiring repeated handling of the semiconductor die (16) and packages (17). The collets (14) are mounted on a removable collet guide block assembly (39) to minimize setup time.

10 Claims, 2 Drawing Sheets

MULTI-CHIP DIE BONDER

BACKGROUND OF THE INVENTION

The present invention relates, in general, to semiconductor device manufacture, and more particularly to attachment of semiconductor die in a package.

The manufacture of high power UHF transistors involves unique requirements due to characteristics of the radio frequency energy. Very small values of inductance and capacitance can have a great effect on the electrical operation of the device. For example, a wire as short as a few millimeters can have significant values of inductance and capacitance in critical parts of the electric circuit. Thus the electrical characteristics of the package which houses the transistor die is itself a critical part of the electric circuit. Furthermore, in order to ensure consistent performance between devices, discrete components such as chip capacitors are typically mounted in the same package as the transistor die. Chip capacitors comprise a single semiconductor die which typically use a metal-oxide semiconductor process to make a high quality capacitor. Furthermore, improper placement of a die can mean that a portion of the die does not completely contact the mounting surface of the package. This lack of contact can severely degrade both the electrical and the thermal characteristics of the resultant product. Exact placement of these components within the package is critical both for electrical and thermal requirements. Finally, the length and routing of the bond wires used to electrically connect these die and the package terminals are very critical. Multiple and parallel bond wires are typically used to control inductive effects and to handle the high current required. A misplaced die can alter the critical routing, spacing and length of the bond wires, at least degrading the electrical performance and potentially allowing bond wires to short to one another causing the transistor to fail.

Typical of such high power UHF transistors is the MRF898 transistor which is manufactured and marketed by Motorola Inc. This transistor can operate with a power level of up to 60 watts, an operating voltage of 24 volts, and a frequency as high as 900 Mhz. Fabrication of the MRF898 requires three chip capacitors bonded to the package in addition to the transistor die. In addition, the MRF898 requires a total of 90 bonding wires, each having a maximum length and height variation of 38.1 micrometers (1.5 mils) from a nominal value. In order to adhere to this tolerance, the placement of each die relative to the other die and to the package terminals is extremely critical. Each die within the package assembly of the MRF898 transistor must be bonded in place within 50.8 micro meters (2 mils) of its desired nominal position. Consistent bonding of these die in the correct positions is one of the most difficult steps of manufacturing the MRF898 transistor.

According to the prior art, most die bonders were only capable of handling one die at a time. Mounting of more than one semiconductor die in a package required that the die bonding step be repeated from start to finish for each die to be mounted. This makes accurate positioning of the die difficult since each alignment step must be performed separately, potentially using a different die bonding machine and operator. This prior art method has been found to have approximately 300,000 parts per million exceed a spacing variation of 50.8 micro-meters from a predetermined nominal position. This requires reworking or scrapping almost one third of the production and is an unacceptably high failure rate.

Repeated heating and subsequent cooling of the package and any semiconductor die already mounted on that package to a temperature of 425 degrees Celsius, required for eutectic bonding, causes extra stress to both the semiconductor die and the package itself. This extra stress can shorten the useful life of the device as well as being wasteful of electrical energy resources. In addition sequentially bonding each semiconductor die requires four separate die bonding operations, effectively using much the same operator and equipment time as would normally be required for four transistors having only a single semiconductor die in each package.

Finally, the chuck used to pick up the individual semiconductor die must be changed to accommodate each type of semiconductor die. Since production batches are often small, significant time is wasted in down time while the chuck and supporting collet are changed and adjusted. In some cases as much as one half of the total time is spent as down time for setup and adjustment even with a single chuck die bonder. A die bonder having multiple chucks requires even more complex setup and adjustment. As a result, a multiple chuck die bonder would require many times the setup time unless some means were provided to pre-align the chucks. Reducing this setup time can significantly increase productivity in all cases but is even more desirable for a die bonder having multiple chucks.

It would be highly desirable to bond a plurality of semiconductor die in place as a single pass operation. This would heat both semiconductor die and package only once, reduce the cost of manufacturing, and would enable more accurate positioning of each semiconductor die within the package. In addition the die bonder must allow for a rapid change from one type of semiconductor die to another.

SUMMARY OF THE INVENTION

Briefly stated, the present invention provides a multi-chip die bonder having a plurality of die handling chucks and associated collets which serve to pick up a plurality of semiconductor die then position and bond each semiconductor die in position on a package. The die bonder can bond the plurality of semiconductor die in a single package without requiring repeated handling of the semiconductor die and packages. The die handling chucks are pre-aligned to reduce the setup time required.

DETAILED DESCRIPTION OF THE DRAWINGS

Figure 1:
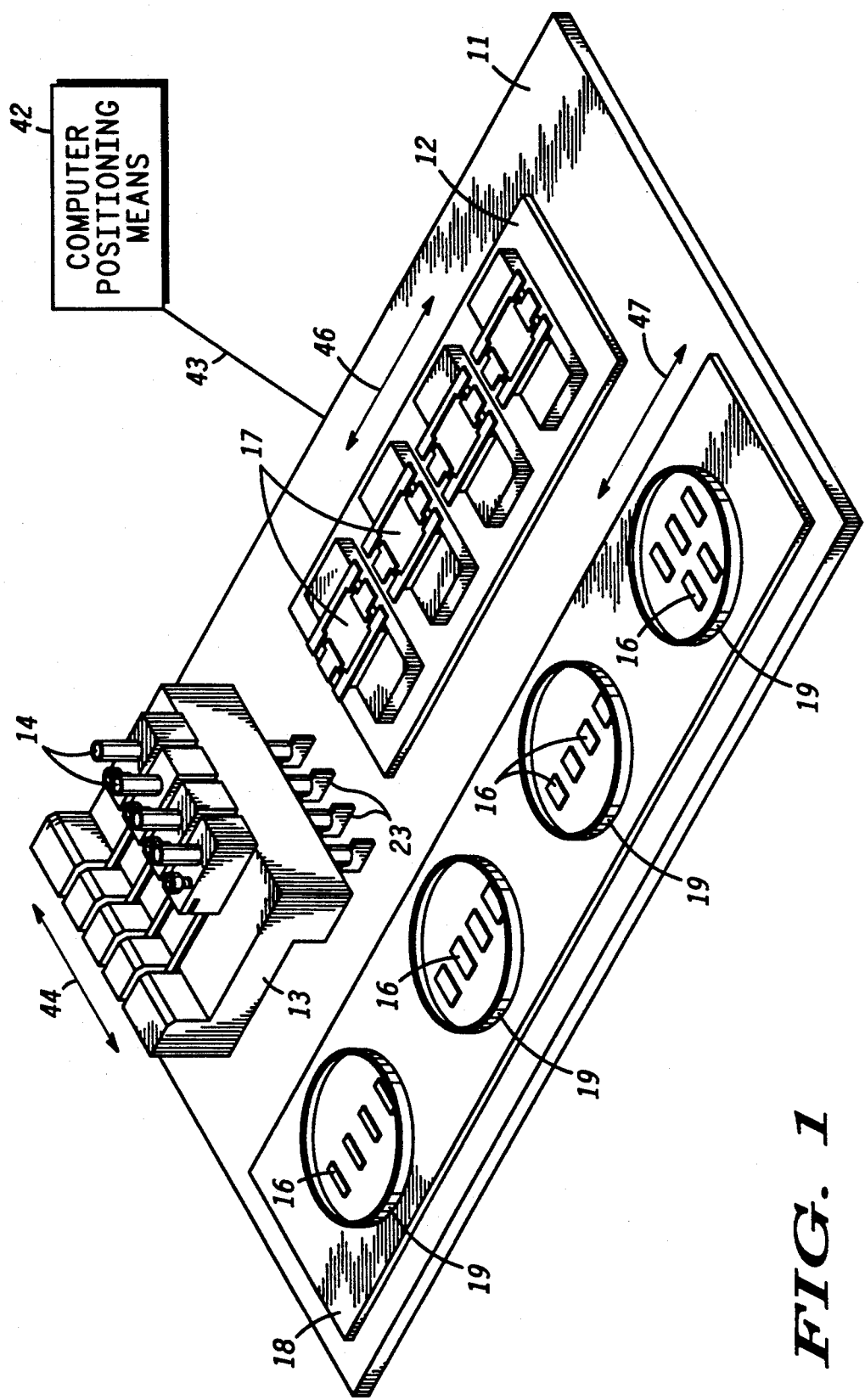
FIG. 1 shows a perspective view of a multi-chip die bonder as a preferred embodiment of the present invention.

FIG. 1 shows a perspective view of a multi-chip die bonder as a preferred embodiment of the present invention. The die bonder comprises a rigid support means 11 which serves to hold the various components accurately in position relative to one another. A plurality of guiding and positioning means is used to obtain a precise movement by the various component parts along a desired axis while allowing only insignificant motion along any other axis. These guiding and positioning means comprise mechanisms well known to those of ordinary skill in the art, such as guide rails, feed screws, or the like. The guiding and positioning means are not shown in the illustrations so as to more clearly show the novel features of the present invention.

At least one package handling tray 12 is mounted on rigid support means 11 by a first guide means (not shown). A double headed arrow 46 illustrates the motion of package handling tray 12 along the first guide means. At least one package 17 is positioned on rigid support means 11 by package handling tray 12. Package 17 may be any of the transistor packages or other multichip substrates commonly used to house semiconductor die and similar devices. A plurality of positioning means, such as pins, serve to align package 17 precisely in position on package handling tray 12. Package handling tray 12 is typically heated by electrical resistance heating so as to heat package 17 to the predetermined eutectic bonding temperature of approximately 425 degrees Celsius.

At least one die handling tray 18 is likewise mounted on rigid support means 11 by a second guide means (not shown). A double headed arrow 47 illustrates the motion of die handling tray 18 along the second guide means. At least one wafer mounting means 19 is positioned on die handling tray 18. Wafer mounting means 19 in turn supports a semiconductor wafer which has been separated into a plurality of semiconductor die 16. Thus wafer mounting means 19 together with die handling tray 18 serve to position the plurality of semiconductor die 16 on rigid support means 11. Typically the same number of wafer mounting means 19 are used as there are types of semiconductor die 16 to be bonded in package 17. Typically each wafer mounting means 19 is used to hold only a single type of semiconductor die 16 such as a transistor die. A second wafer mounting means 19 is then used for a second type of semiconductor die 16 such as a predetermined value of chip capacitor die. More wafer mounting means 19 are used for as many types of semiconductor die 16 as are desired. However, if two or more semiconductor die 16 of the same type are to be bonded in package 17 then for convenience typically two or more separate wafer mounting means 19 are used for the two or more same type of semiconductor die 16.

A head assembly 13 is supported by a third guide means (not shown) at a predetermined height above rigid support means 11. A double headed arrow 44 illustrates the motion of head assembly 13 along the third guide means. Head assembly 13 is free to move back and forth from a position above die handling tray 18 to a position above package handling tray 12 while accurately maintaining the predetermined height and lateral positioning of head assembly 13. Head assembly 13 in turn supports a plurality of collets 14 which are free to move in a vertical direction through head assembly 13. Each collet 14 is attached to one of a plurality of die handling chucks 23. The plurality of die handling chucks 23 and associated collets 14 serve to pick up the plurality of semiconductor die 16 then position and bond semiconductor die 16 in position on the at least one package 17.

In the preferred embodiment, the positions along their respective guide means of each collet 14, head assembly 13, die handling tray 18, and package handling tray 12 is precisely controlled by a computer positioning means 42 of a type well known in the art. Thus computer controlled positioning means 42 is used to control and coordinate the positioning of the plurality of die handling chucks 23, the plurality of semiconductor die 16, and package 17 through a coupling mechanism 43. The line illustrating coupling mechanism 43 is used to symbolize the coupling of control from computer positioning means 42 to the parts which are positioned under the control of computer positioning means 42. Once each semiconductor die 16 is manually aligned with the appropriate die handling chuck 23, computer positioning means 42 precisely controls the placement and bonding of each semiconductor die 16 on package 17.

Operation of the die bonder proceeds as follows: The die bonder operator optically aligns the package 17 in a predetermined position for bonding. Next the die bonder operator selects a particular semiconductor die 16 from the supply held on wafer mounting means 19. The operator optically aligns one of the plurality of die handling chucks 23 with one of the plurality of semiconductor die 16. Die handling chuck 23 is then lowered and semiconductor die 16 picked up by die handling chuck 23. Die handling chuck 23 is coupled to a vacuum system (not shown) which serves to hold semiconductor die 16 against die handling chuck 23. Computer positioning means 42 then positions die handling chuck 23 for attaching the first semiconductor die 16 to a desired location on the package 17. Die handling chuck 23 is then lowered into place and semiconductor die 16 is automatically scrubbed on the mounting surface of package 17 according to a predetermined program. Typically this scrubbing comprises a repeated back and forth motion to "wet" both surfaces being bonded, ensuring a good bond. This "wetting" process serves to form an alloy of gold from the package combined with gold-silicon eutectic from the die. The correct scrubbing sequence ensure that this eutectic is formed evenly and without voids across the bonding surface. Vacuum is then removed from the chuck, releasing the die to complete the bonding process. The chuck alignment, pick up, placement, scrubbing, and bonding process is repeated for each of the remainder of the plurality of semiconductor die 16. In a preferred embodiment, all of the plurality of die handling chucks 23 are aligned and the respective semiconductor die 16 picked up before any are placed, scrubbed and bonded. Alternative embodiments perform all steps separately for each die or use some combination of the two orderings.

The preferred embodiment employs an automatic controlling means whereby an operator aligns the desired package 17 to a predetermined location, aligns each die with the respective die handling chuck 23, then each semiconductor die 16 is automatically bonded at a desired position within the package 17. No further operator action is required until all semiconductor die 16 are bonded to the package 17. This method has typically resulted in die bonding the plurality of semiconductor die 16 on the package having fewer than 450 parts per million exceed a spacing variation of 50.8 micro-meters from a predetermined value before any rework of defective die.

Alternative embodiments of the present invention include moving head assembly 13 in two axes such that no moveable trays are required. Another embodiment holds head assembly 13 rigidly in place while moving die handling tray 18 and package handling tray 12 into the positions required for picking up and bonding each die. Other embodiments use a plurality of head assemblies 13 linked either mechanically such as with a lever arm or functionally by means of the computer controlled positioning mechanism.

Figure 2:
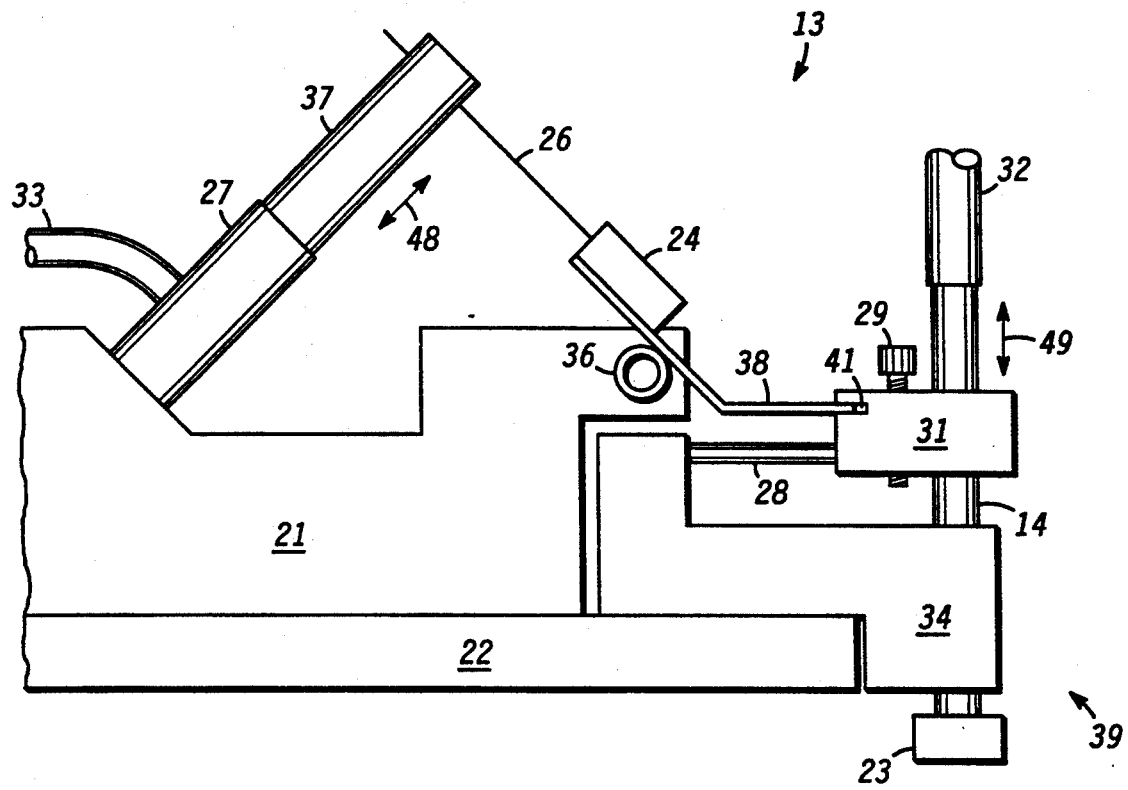
FIG. 2 shows the head assembly of the preferred embodiment of the present invention in greater detail.

FIG. 2 shows a detailed view of head assembly 13, a part of the preferred embodiment of the present invention illustrated in FIG. 1. FIG. 2 shows a view of head assembly 13 as seen from front of the bonding machine. A holder bracket 22 supports the major components and is itself fastened to the third guide means. A support bracket 21 is fastened to holder bracket 22. A pneumatic mechanism is used to raise and lower the die handling chucks. A miniature pneumatic cylinder 27 is mounted on support bracket 21. An air hose 33 serves to supply air to miniature pneumatic cylinder 27. Supplying air to miniature pneumatic cylinder 27 causes a plunger 37 to extend further from support bracket 21, in a direction illustrated by a double headed arrow 48. This motion is coupled through a spring 26 to a spring guide 24. Spring guide 24 is fastened to a hinge bracket 38 which in turn is supported by a pivot 36. Spring 26 closely fits into a hole in spring guide 24. Spring 26 thus acts as a lever to turn spring guide 24 and hinge bracket 38 about pivot 36. The motion of hinge bracket 38 is coupled to a slot 41 in a collet positioning block 31. Collet positioning block 31 is clamped to collet 14, serving to determine the vertical position of collet 14. Collet positioning block 31 and collet 14 are free to move in a direction shown by a double headed arrow 49. Collet 14 supports a die handling chuck 23 which is used to actually pick up the die. The overall effect of this motion coupling is that supplying air to miniature pneumatic cylinder 27 causes the extension of plunger 37 which in turn causes die handling chuck 23 to be lowered. When compressed air is no longer supplied to miniature pneumatic cylinder 27, plunger 37 retracts to a rest position and the motion is coupled to die handling chuck 23 causing it to return to a raised position.

A height adjusting screw 29 allows precise adjustment of the lowest position of die handling chuck 23. This position is typically adjusted so as to allow die to be picked up by means of a vacuum supplied by a vacuum hose 32 through a hole (not shown) passing through collet 14 and die handling chuck 23. Collet 14 is held by a collet guide block 34. Since the lateral alignment of collet 14 and hence of die handling chuck 23 is extremely critical, collet guide block 34 must be fabricated to hold collet 14 with minimal side to side motion. To minimize this undesired motion despite the wear caused by continual up and down motion, collet guide block 34 is typically fabricated using a commercially available graphite material such as Poco DFP-1. A guide rod 28 slides up and down with collet positioning block 31, guided by a slot (not shown) fabricated in collet guide block 34 to minimize any undesired twisting motion of collet 14.

Die handling chuck 23 is made to fit a specific die size and shape. To die bond a different type of die, die handling chuck 23 must be exchanged for a similar chuck which fits the new die. In addition, different products may require a different arrangement or a different number of collets 14 and die handling chuck 23. This exchange is facilitated by using a removable collet guide block assembly 39 comprising: die handling chuck 23, collet 14, collet positioning block 31, height adjusting screw 29, guide rod 28, and collet guide block 34. Removable collet guide block assembly 39 supports and accurately pre-aligns the plurality of die handling chucks 23 and associated collets 14 so the entire assembly may be exchanged with another similar assembly without requiring further adjustment. Removable collet guide block assembly 39 is typically mounted on holder bracket 22 by means of locator pins and setscrews placed so as to ensure accurate mounting without adjustment. Furthermore, hinge bracket 38 fits into slot 41 fabricated in one end of collet positioning block 31, thus facilitating replacement of removable collet guide block assembly 39 without manipulating extra fasteners.

For clarity, only a single die handling chuck 23, collet 14 together with the associated raising and lowering mechanism is shown in FIG. 2. The preferred embodiment of this invention includes a plurality of additional die handling chucks 23, collets 14, miniature pneumatic cylinders 27, plungers 37, springs 26, spring guides 24, hinge bracket 38, and guide rods 28. The additional die handling chucks 23 and collets 14 are positioned in line on removable collet guide block assembly 39 as shown in FIG. 1. Thus the entire plurality of die handling chucks 23 and collets 14 may be exchanged simultaneously and without operator adjustment.

It should now be clear that the present invention provides a die bonder which can bond a plurality of semiconductor die in place as a single operation. This die bonder heats both die and package only once, reduces the cost of manufacturing, and enables more accurate positioning of each die within the package compared to the prior art. The head assembly is easily replaced without requiring operator adjustment, much facilitating the changes which are required between production batches.

I claim:

1. A multi-chip die bonder, comprising:
   a rigid support means which positions a plurality of workpieces, the workpieces comprising a plurality of semiconductor die and a package therefor; and
   a plurality of die handling chucks and associated collets which serve to pick up the plurality of semiconductor die then position and bond each semiconductor die in a precise, predetermined position on the package.

2. The multi-chip die bonder of claim 1 further comprising:
   a pneumatic mechanism used to raise and lower the die handling chucks.

3. The multi-chip die bonder of claim 1 further comprising:
   an automatic controlling means whereby an operator aligns the at least one package to a predetermined location, aligns each semiconductor die with a respective die handling chuck, then each semiconductor die is automatically bonded at a desired position within the package.

4. A multi-chip die bonder, comprising:
   a rigid support means which supports a plurality of workpieces, the workpieces comprising a plurality of die and a package therefor;
   a plurality of die handling chucks and associated collets which serve to pick up a plurality of die then position and bond each die in position on the package; and
   a removable collet guide block assembly which supports and accurately pre-aligns the plurality of die handling chucks and the associated collets so the entire assembly may be exchanged with another similar assembly without requiring further adjustment.

5. The multi-chip die bonder of claim 4 wherein the removable collet guide block assembly has a collet guide block that is fabricated from a graphite material.

6. A multi-chip die bonder, comprising:
- a rigid support means which positions a plurality of workpieces, the workpieces comprising a plurality of die and at least one package therefor;
- a plurality of die handling chucks and associated collets which serve to pick up a plurality of die then position and bond each die in position on the package; and
- a computer controlled positioning means used to control and coordinate the positioning of the plurality of die handling chucks, the plurality of die, and the at least one package.

7. The multi-chip die bonder of claim 6 wherein the plurality of die handling chucks and associated collets are mounted on a collet guide block.

8. The multi-chip die bonder of claim 6 wherein each die is scrubbed on a mounting surface of the at least one package according to a predetermined program.

9. The multi-chip bonder of claim 6 wherein the plurality of die are bonded to the at least one package while having fewer than 500 parts per million exceed a spacing variation of 50.8 micro-meters from a predetermined value.

10. A multi-chip die bonder, comprising:
- a rigid support means;
- at least one package positioned on the rigid support means;
- a plurality of die handling chucks which serve to handle a plurality of semiconductor die, wherein the die handling chucks position and bond each semiconductor die in a predetermined position on the package; and
- a removable collet guide block assembly which supports and accurately pre-aligns the die handling chucks in such a way that the entire guide block assembly may be exchanged with another similar guide block assembly without requiring further adjustment.

* * * * *